United States Patent
Xiao et al.

(10) Patent No.: US 10,381,926 B2
(45) Date of Patent: Aug. 13, 2019

(54) DIGITALLY COMPENSATED HYSTERETIC POWER SUPPLY WITH ENHANCED RESOLUTION

(71) Applicants: Peng Xiao, Andover, MA (US); Markus Ziegler, Munich (DE)

(72) Inventors: Peng Xiao, Andover, MA (US); Markus Ziegler, Munich (DE)

(73) Assignee: OSRAM SYLVANIA Inc., Wilmington, MA (US)

( * ) Notice: Subject to any disclaimer, the term of this patent is extended or adjusted under 35 U.S.C. 154(b) by 96 days.

(21) Appl. No.: 14/864,838

(22) Filed: Sep. 24, 2015

(65) Prior Publication Data

US 2017/0093280 A1   Mar. 30, 2017

(51) Int. Cl.
| | |
|---|---|
| H02M 3/157 | (2006.01) |
| H02M 7/5395 | (2006.01) |
| H03M 1/68 | (2006.01) |
| H02M 3/156 | (2006.01) |
| H03M 1/82 | (2006.01) |

(Continued)

(52) U.S. Cl.
CPC ........... *H02M 3/157* (2013.01); *H02M 3/156* (2013.01); *H02M 7/5395* (2013.01); *H03M 1/68* (2013.01); *H02M 2001/0012* (2013.01); *H03M 1/822* (2013.01); *H05B 33/08* (2013.01)

(58) Field of Classification Search
CPC .................................................. H02M 3/157
See application file for complete search history.

(56) References Cited

U.S. PATENT DOCUMENTS

| | | | |
|---|---|---|---|
| 5,932,938 A | * | 8/1999 | Shimamori ........... H02M 3/157 307/125 |
| 8,674,614 B2 | | 3/2014 | Angelin et al. |
| 2007/0153026 A1 | | 7/2007 | Ashdown |

(Continued)

FOREIGN PATENT DOCUMENTS

| | | |
|---|---|---|
| WO | 2007071033 A1 | 6/2007 |
| WO | 2013098704 A1 | 7/2013 |
| WO | 2013098706 A1 | 7/2013 |

OTHER PUBLICATIONS

Waters, Duncan, International Search Report and Written Opinion of the International Searching Authority for PCT/US2016/051309, dated Feb. 2, 2017, pp. 1-13, European Patent Office, Rijswijk, The Netherlands.

*Primary Examiner* — Yusef A Ahmed
*Assistant Examiner* — Lakaisha Jackson
(74) *Attorney, Agent, or Firm* — Shaun P. Montana

(57) ABSTRACT

A digitally compensated hysteretic power supply with enhanced resolution is provided. Such a power supply includes a comparator that is used to compare a load current sense signal with an internal signal generated from a digital-to-analog converter (DAC). A compensation circuit at a DAC input operates to improve current accuracy beyond the given DAC resolution. The current sense signal is converted to its digital equivalent, which is fed to a proportional-integral (PI) compensation loop, which in turn generates a relatively precise high resolution DAC input value. The DAC uses the higher part of the DAC value. The lower part of the DAC value is treated as a duty cycle number, and the DAC output is toggled between two levels at this duty cycle. This toggling generates a current output signal having a value that is the average of the two toggled values.

19 Claims, 4 Drawing Sheets

(51) Int. Cl.
    *H05B 33/08*      (2006.01)
    *H02M 1/00*       (2006.01)

(56)            References Cited

U.S. PATENT DOCUMENTS

2009/0134817 A1*  5/2009  Jurngwirth ......... H05B 33/0827
                                                      315/307
2015/0035510 A1*  2/2015  Hoshino ............... H02M 3/157
                                                      323/283

* cited by examiner

DIGITALLY COMPENSATED HYSTERETIC POWER SUPPLY WITH ENHANCED RESOLUTION

TECHNICAL FIELD

The present invention relates to electronics, and more specifically, to drivers that provide power to solid state light sources.

BACKGROUND

Solid state light sources receive electrical power via power supplies, also referred to as drivers or driving circuits. Some typical driving circuits are configured with a switch-mode power supply topology, and include a bulk storage capacitor in parallel with the solid state light source(s) being powered, and a power transistor (e.g., MOSFET) that is switched on and off in a pulsed fashion so as to effectively allow the capacitor to remain sufficiently charged so that current can be provided to the solid state light source(s) without noticeable flashing or dimming. Depending on the input power source, a bridge rectifier as well as primary and secondary sides separated by galvanic isolation may also be included in the topology, with the primary side for receiving and processing the input power source and the secondary side for feeding the resulting current to the load. In off-line drivers, the output switching stage is typically configured as a buck or boost converter that converts a fixed voltage to a constant current to drive the solid state light source(s). In such constant-current driver configurations, a dedicated analog integrated circuit (IC) is used to sense the output current, compare it with a reference value, and regulate the pulse-width of power MOSFET switching.

SUMMARY

As noted above, the output switching stage of a typical off-line driver is configured to convert a fixed voltage to a constant current to drive one or more solid state light source(s). The buck/boost converter topology is commonly used, but any other suitable switching power supply topology may be used as well. In any such case, the output switching stage is commonly controlled by a dedicated, relatively expensive, analog IC configured to maintain constant current output by sensing the output current, comparing it with a reference value, and regulating the pulse-width of the power MOSFET or other suitable transistor switching circuit to maintain the constant current.

Embodiments provide a digitally compensated hysteretic power supply with enhanced resolution. Due to the compensation provided, the power supply uses relatively low cost, low resolution digital-to-analog conversion (DAC) and comparator circuitry to assess the current output and to generate an appropriate PWM drive signal to gate the power switching transistor in a modulated fashion. A compensation circuit on the input of the DAC is configured to toggle the input of the DAC within a given PWM cycle so that an average output of the DAC per cycle effectively allows for current control at a resolution finer than the smallest step of the DAC. Such a digitally compensated power supply is particularly well-suited for regulating current in driver applications, although it can be used with any number of loads.

In more detail, to regulate the current through the solid state light source(s), a resistor is used to sense the current. To keep the voltage drop across the sense resistor low so as to reduce losses, a very small resistor value (e.g., 0.1~0.2Ω) is used. Following Ohm's law, this means that a very low voltage will be generated across the sensing resistor (e.g., 100 mV for 1 A of drive current through a sense resistor of 0.1Ω). A comparator is used to compare the current sense signal with an internal target current signal generated using a digital to analog converter (DAC). However, a challenge here is the relatively low resolution of the DAC output signal. For example, assume a 2.56V reference voltage and a 10-bit DAC. In such an example case, each least significant bit (LSB) of the DAC input represents $2.56/2^{10}$ or 2.56/1024, which equals 2.5 mV per bit at the DAC output. For a 0.1Ω sense resistor, this smallest voltage step of 2.5 mV translates to a 25 mA current step. Thus, in such a scenario, the DAC and comparator collectively can only regulate current at 25 mA steps. The compensation circuit at the input of the DAC operates to improve current accuracy. In some embodiments, the compensation circuit includes an amplifier, an analog-to-digital converter (ADC), and a proportional-integral (PI) controller. The current sense signal is amplified by the amplifier to a voltage level suitable for processing, which is then converted to its digital equivalent via the ADC. The digital equivalent is fed to the PI compensation loop, which in turn compares the sense current value to the target current value and generates the target DAC input value. This target DAC input value has a higher resolution than the DAC itself. As such, the DAC only uses the most significant bits of the target DAC input value. The least significant bits of the target DAC input value are treated as a duty cycle number.

In more detail, to effectively improve the resolution of the DAC, the DAC input and therefore the DAC output, is toggled between two adjacent levels at the given duty cycle defined by the target DAC input value. For example, assume the target DAC input value generated by the PI compensation loop is '00000010000100' and further assume the DAC has a resolution of 10-bits and a max output of 2.56 volts. Thus, the ten MSBs of the target DAC input value provide a first DAC input value of '0000001000' and the second or next adjacent DAC input value is therefore '0000001001'. In addition, the four LSBs of the target DAC input value provide duty cycle value of '0100' or 25%. In more detail, since this LSB portion in this example case is 4-bits, it has a range of 0 to 15. So, 0=>0/16=0%, 1=>1/16=6.25%, 2=>2/16=12.5%, . . . 15=>15/16=93.75%. So, a 4-bit LSB portion of '0100'=4 (decimal)=>4/16=25%. Thus, continuing with the example, if the DAC input is toggled between '0000001000' and '0000001001' at a 25% duty cycle, then the DAC output is toggled between 20 mV and 22.5 mV at a 25% duty cycle. Assuming the current sensing resistor is 0.1Ω, then a current of 0.02V/0.1=0.5 A=200 mA ('0000001000'=8=>8/1024*2.56/0.1=0.2 A=200 mA) is produced. The average output current resulting from this example scenario would be 206.25 mA, as computed by: (200 mA*0.75+225 mA*.25)). Note that the current without such toggling would be either 200 mA or 225 mA, corresponding to the DAC inputs of 0000001000 and 000001001, respectively.

In some embodiments, a microcontroller is used to achieve this hysteretic constant-current control of a driver circuit. In some embodiments, the microcontroller includes an amplifier, ADC, DAC, comparator, and the PI controller to reduce the number of external components. High output current accuracy and resolution are achieved with feedback compensation and pulse width modulation (PWM) level shifting. Thus, a more costly dedicated analog IC is not needed or is otherwise replaced with a digital implementation as provided herein, using a relatively low cost microcontroller to achieve superior performance compared to analog designs.

A number of benefits and advantages will be apparent. For example, a power supply configured according to embodiments described herein reduces the bill of materials cost by eliminating a dedicated analog IC and its surrounding components, which are relatively more expensive than a generic configurable microcontroller. In addition, the hysteretic current control provides a very fast dynamic response, simple control scheme, stable and robust operation, and fixed current ripple level. Also, a closed-loop compensation is used to achieve accurate output current level, and a pulse-width modulation technique is used to further increase the resolution of the control loop, while achieving flicker-free light output. Moreover, the digital microcontroller effectively provides a direct digital interface with other digital devices for dimming or other controls.

Although some embodiments are described in the context of a buck converter, other isolated power supply topologies having a constant-current output stage can also utilize the techniques provided herein for hysteretic constant-current control, such as a boost converter, buck-boost converter, flyback converter, ringing choke converter, half-forward converter, push-pull converter, half-bridge and full-bridge converter, resonant converter, and Ćuk converter topologies, as will be appreciated. The conversion may be, for example, from AC to AC, AC to DC, DC to AC, or DC to DC. As will be further appreciated, other loads will be apparent and the driver circuitry need not be limited to lighting applications. In addition, the circuitry depicted as being internal to the microcontroller, such as the comparator, ADC, DAC, PI controller, and/or the amplifier, in some embodiments, is external to the microcontroller. To this end, the microcontroller is not necessarily needed, as will be appreciated.

In an embodiment, there is provided a power supply control system. The power supply control system includes: an input stage configured to receive an input source voltage and process that voltage so as to provide a current; a switching output stage configured to receive current from the input stage either directly or by way of a galvanic isolation barrier, the output stage including a switch configured to pass at least a portion of the received current to a load; and a control circuit configured to provide a pulse width modulated (PWM) control signal to the switch of the switching output stage, wherein the PWM control signal has an off-level that corresponds to an off-state of the switch, and two distinct on-levels that each corresponds to an on-state of the switch, thereby allowing first and second on-state current levels to pass to the load.

In a related embodiment, the switching output stage may include a bulk storage capacitor configured to be in parallel with the load, when the load is present. In another related embodiment, the switch may be a power field effect transistor include a gate, a source, and a drain, and the PWM control signal may be applied to the gate of the power field effect transistor.

In yet another related embodiment, the control circuit may include an analog-to-digital converter (ADC) configured to receive a sense signal indicative of a load current and to convert that signal to a digital sense signal; a compensation module configured to compare the digital sense signal with a target signal, and to generate a digital control output having a number of bits including at least one bit that is toggled from a first state to a second state according to a toggling duty cycle; and a digital-to-analog converter (DAC) configured to receive the digital control output and to generate a corresponding analog PWM signal that toggles from a first on-state level to a second on-state level according to the toggling duty cycle, the first and second on-state levels corresponding to the two distinct on-levels, respectively.

In a further related embodiment, the control circuit may further include an analog comparator configured to receive the sense signal and the analog signal from the DAC, and to generate a drive signal. In a further related embodiment, the control circuit may further include a gate driver configured to receive the drive signal from the analog comparator and to drive the switch. In another further related embodiment, the control circuit may further include an amplifier configured to receiving the sense signal and to provide an amplified version of that sense signal to the ADC. In a further related embodiment, at least one of the ADC, the compensation module, the DAC, the analog comparator, the gate driver, and the amplifier may be included in a microcontroller.

In another further related embodiment, the digital control output may have more bits than the DAC resolution can accommodate, such that only the most significant bits of the digital control output are applied to the DAC and the remaining bits define the toggling duty cycle.

In yet another further related embodiment, the at least one bit that is toggled from a first state to a second state according to the toggling duty cycle may be toggled at a fixed frequency.

In still another related embodiment, the power supply control system may further include a sense resistor across which the sense signal is taken.

In another embodiment, there is provided a power supply control circuit. The power supply control circuit includes: an analog-to-digital converter (ADC) configured to receive a sense signal indicative of a load current, and to convert that signal to a digital sense signal; a compensation module configured to compare the digital sense signal with a target signal, and to generate a digital control output having a number of bits including at least one bit that is toggled from a first state to a second state according to a toggling duty cycle; and a digital-to-analog converter (DAC) configured to receive the digital control output and to generate a corresponding analog pulse width modulation (PWM) signal that toggles from a first on-state level to a second on-state level according to the toggling duty cycle, the first and second on-state levels corresponding to two distinct on-states, respectively, of an output switch of a switching power supply.

In a related embodiment, the power supply control circuit may further include an analog comparator configured to receive the sense signal and the analog signal from the DAC, and to generate a drive signal. In a further related embodiment, the power supply control circuit may further include a gate driver configured to receive the drive signal from the analog comparator and to drive the output switch. In a further related embodiment, the power supply control circuit may further include an amplifier configured to receive the sense signal and to provide an amplified version of that sense signal to the ADC. In a further related embodiment, at least one of the ADC, the compensation module, the DAC, the analog comparator, the gate driver, and the amplifier may be included in a microcontroller.

In another related embodiment, the digital control output may have more bits than the DAC resolution can accommodate, such that only the most significant bits of the digital control output are applied to the DAC and the remaining bits define the toggling duty cycle.

In still another related embodiment, the at least one bit that is toggled from a first state to a second state according to the toggling duty cycle may be toggled at a fixed frequency.

In yet another related embodiment, the compensation module may include a processor configured to compare the digital sense signal with the target signal, to generate the digital control output, and to toggle the at least one bit from a first state to a second state according to the toggling duty cycle.

In another embodiment, there is provided a computer program product, stored on a non-transitory computer readable medium, including instructions that, when executed on a processor as a switching power supply control process, cause the processor to perform operations of: comparing a digital version of a current sense signal with a target signal, the current sense signal representative of a load current; generating, based on the comparison, a digital control output having a number of bits; providing the digital control output to a digital-to-analog converter (DAC), wherein the digital control output has more bits than the DAC resolution can accommodate, such that only the most significant bits (MSBs) of the digital control output are applied to the DAC and the remaining bits define a toggling duty cycle; and toggling the least significant bit of the MSBs from a first state to a second state according to the toggling duty cycle, thereby causing the DAC to generate a corresponding analog signal that toggles from a first state to a second state according to the toggling duty cycle, the first and second states corresponding to two distinct on-levels, respectively, of an output switch of a switching power supply.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

A digitally compensated hysteretic power supply with enhanced resolution is disclosed. In some embodiments, a comparator is used to compare a load current sense signal with an internal target signal generated from a digital to analog converter (DAC), wherein the DAC and the comparator collectively provide a given current adjustment resolution (depending on resolution of the DAC and the voltage reference value). A compensation circuit at the input of the DAC operates to improve current accuracy beyond the given resolution. In particular, the current sense signal is converted to its digital equivalent via an analog-to-digital converter (ADC), and the digital equivalent is fed to a proportional-integral (PI) controller compensation loop, which in turn generates a relatively precise high resolution DAC input value. This high resolution DAC value includes more bits that can be processed by the lower resolution DAC. As such, the DAC uses the higher part (most significant bits) of the DAC value. The lower part (least significant bits) of the DAC value is treated as a duty cycle number, and the DAC output is toggled between two levels at this duty cycle. This toggling allows for a pulse width modulated (PWM) control signal to the converter output switch, wherein the PWM control signal has an off-level that corresponds to an off-state of the switch, and two distinct on-levels that each corresponds to an on-state of the switch, thereby allowing first and second on-state current levels to pass to the load. Such PWM level shifting (with respect to the distinct on-state levels) generates a current output signal having a value that is the average of the two toggled DAC values, thereby providing a load current that is somewhere between discrete current steps of the of the DAC and comparator circuit.

Figure 1:
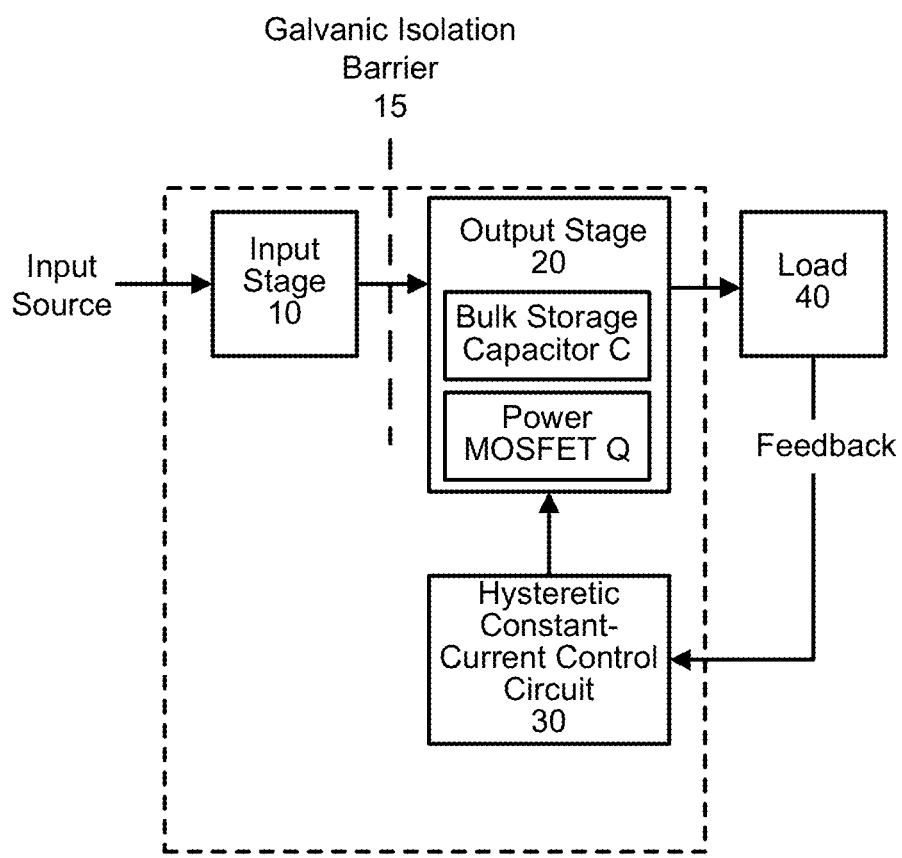
FIG. 1 illustrates a block diagram of a power supply according to embodiments disclosed herein.

FIG. 1 illustrates a block diagram of a power supply system that includes an input stage 10 operatively coupled with a switching output stage 20, which is capable of driving a load 40. Each of the input stage 10 and the output stage 20 are generally implemented as conventionally done, using any desired switching power supply topologies, such as but not limited to buck, boost, buck-boost, flyback, or other topologies having a constant-current output stage. A hysteretic constant-current control circuit 30 senses the current through the load 40 via a feedback path, and generates a pulse width modulated (PWM) drive signal that gates or otherwise drives the switching circuit of the output stage 20. The input stage 10 is configured to receive an input source voltage and process that voltage as needed. The processing will depend on the input voltage and desired output voltage, and in some embodiments include, for example, rectification, filtering, step-up, step-down, or other typical input stage processing. The output stage 20 receives current from the input stage 10 either directly or by way of a galvanic isolation barrier 15 (e.g., a transformer), and drives the load 40 with that current according to a PWM scheme and based on the PWM drive signal received from the hysteretic constant-current control circuit 30. In some embodiments, the output stage 20 includes a bulk storage capacitor C in parallel with the load 40, and a power MOSFET Q that switches current into the load according to the PWM signal received from the control circuit 30. The bulk storage capacitor C effectively powers the load 40 when the power MOSFET Q is in an open state, and recharges when the power MOSFET Q is in a closed state.

Thus, the input stage 10 is configured to receive an input source voltage and process that voltage so as to provide a current. The output stage 20 is configured to receive current from the input stage either directly or by way of the galvanic isolation barrier 15, and includes a switch (e.g., the power MOSFET Q) that passes at least a portion of the received current to the load 40. The control circuit 30 is configured to provide a PWM control signal to the switch of the output stage 20 (e.g., a gate drive signal for the power MOSFET Q). The PWM control signal has an off-level that corresponds to an off-state of the switch, and two distinct on-levels that each corresponds to an on-state of the switch, thereby allowing first and second on-state current levels to pass to the load 40. In a more general sense, numerous input stage 10 and output stage 20 configurations will be apparent, and the control circuit 30 is used to provide the multi-level PWM drive signal for any of them, so as to allow for greater load current control. Further details of the control circuit 30 will be provided with reference to FIGS. 2 through 4.

Figure 2:
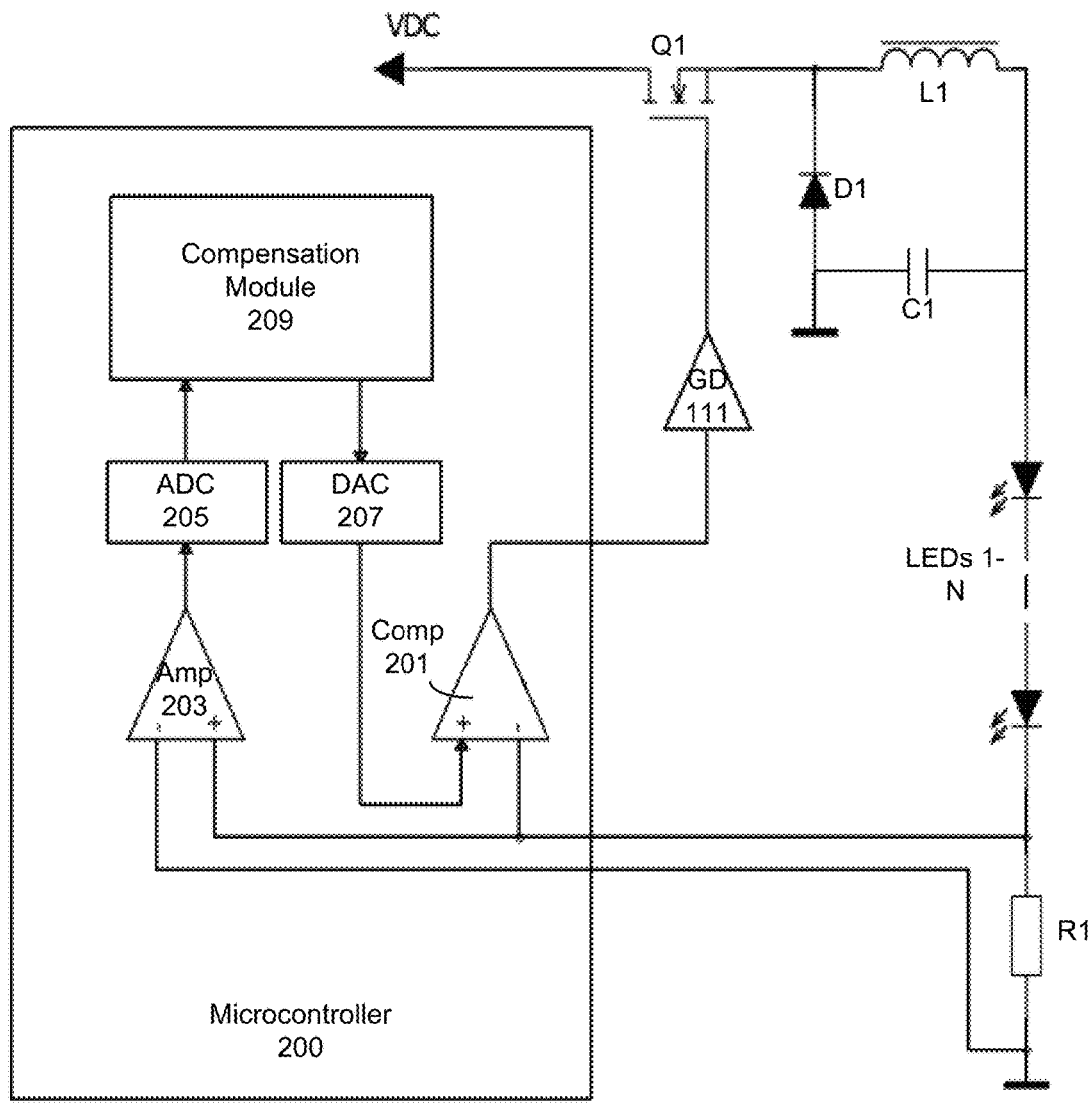
FIG. 2 illustrates a schematic diagram of a power supply according to embodiments disclosed herein.

FIG. 2 illustrates a schematic diagram of a power supply in the context of a buck converter driving a lighting load LEDs 1-N, although any switching converter topology can be used in conjunction with the techniques provided herein to drive any type of load. An input voltage source VDC is connected to a source of a transistor Q1. A drain of the transistor Q1 is connected to a cathode of a diode D1 and an inductor L1. An anode of the diode D1 is connected to a capacitor C1 and ground. The capacitor C1 and the inductor L1 are connected to each other, and to the lighting load LEDs 1-N. The lighting load LEDs 1-N is also connected to a sense resistor R1, which is also connected to ground. A microcontroller 200 is connected to the sense resistor R1, more specifically across the sense resistor R1, and provides an output to a gate driver ("GD") 111, which provides a gate drive signal to a gate of the transistor Q1. Within the microcontroller 200 are a compensation module 209, an analog-to-digital converter ("ADC") 205, a digital-to-analog converter ("DAC") 207, a differential amplifier ("Amp") 203, and an analog comparator ("Comp") 201. A non-inverting input of the differential amplifier 203 and an inverting input of the analog comparator 201 are connected between the lighting load LEDs 1-N and the sense resistor R1. An inverting input of the differential amplifier 203 is connected between the sense resistor R1 and ground. An output of the differential amplifier 203 is connected to the ADC 205, which is connected to the compensation module 209. The DAC 207 is also connected to the compensation module 209 and to the non-inverting input of the analog comparator 201. An output of the comparator 201 is connected to the gate driver 111.

In operation, the current in the inductor L1 is controlled by the transistor Q1 and the diode D1. When the transistor Q1 is closed (conducting), the capacitor C1 charges to the output voltage and the voltage across the inductor L1 equals the input voltage source VDC minus that output voltage. As the diode D1 is reverse-biased by the input voltage source VDC, no current flows through it. However, when the transistor Q1 is opened (not conducting), the voltage across the capacitor C1 begins to deplete according to the given RC time constant and the diode D1 is forward biased, and the voltage across the inductor L1 equals to the output voltage (opposite polarity, and neglecting the drop across the diode D1). The load current through the lighting load LEDs 1-N decreases, which is sensed via the sense resistor R1, which in turn allows the microcontroller 200 to issue a PWM control signal to the gate of transistor Q1 via the gate driver 111. An output of the gate driver 111 is referred to as a gate drive signal. As will be further appreciated, the gate driver signal is toggled between two voltage levels during a given cycle (or so-called PWM level shifting), thereby providing high current accuracy and resolution.

In some embodiments, a buck converter as shown is implemented using an Atmel AT90PWM81 microcontroller for the microcontroller 200. However, any number of microcontrollers can be used, as will be appreciated, and embodiments are not intended to be limited to any particular one. Furthermore, as previously explained, other embodiments may be implemented without a microcontroller, wherein the various functional components are implemented as individual discrete components that are operatively coupled together as shown in FIG. 2 or in an otherwise suitable fashion to bring about the functionalities provided herein. The discrete components may include, for example, a comparator, an amplifier, an ADC, a DAC, a processor, and a memory configured to store a compensation module or routine executable by the processor.

To achieve current regulation, the sense resistor R1 is a relatively small resistor (e.g., 0.1~1.0Ω). The signal across the sense resistor R1 is fed into the microcontroller 200, and is received by the inverting input of the analog comparator 201, and compared with a reference voltage applied to the non-inverting input of comparator 201. The reference voltage is generated by the DAC 207. The output of the comparator 201 is then used to drive the transistor Q1 through the gate driver 111. As will be appreciated, the hysteresis band of the analog comparator 201 is programmable by virtue of the compensation module 209, and determines the fixed level of the current ripples. By changing the value of the output generated by the DAC 207 (and ultimately the PWM gate drive signal applied to the gate of the transistor Q1), the current through the lighting load LEDs 1-N is adjusted. As will be further appreciated, hysteretic as used herein generally refers to action of the analog comparator 201. In hysteretic control, the sensed output current I is compared with a reference level Iref, wherein if I>(Iref+ΔI), the transistor Q1 turns off, causing the output current to decrease. If I<(Iref−ΔI), the transistor Q1 turns on, causing the output current to increase. The DAC 207 sets the value of Iref, while ΔI is a hysteresis band level configured by the analog comparator 201.

As will be further appreciated, note that using the analog comparator 201 alone achieves a certain degree of current control, but it does not ensure accurate output current regulation. In particular, due to delays in the analog comparator 201 and the gate driver 111, the actual output current varies with input and output voltage, and the nature of the load (the lighting load LEDs 1-N here in FIG. 2). Therefore, a closed-loop control scheme can be used, as provided herein. This can be accomplished, for example, by amplifying the small input current flowing through the sense resistor R1 with the differential amplifier 203, sampling the sense signals into digital numbers with the ADC 205, and using the compensation module 209 to adjust the input value of the DAC 207 and ultimately the output value of the DAC 207, until the measured average output current sensed by the sense resistor R1 reaches a specific reference value.

Further note, however, that there is a difficulty in implementing the closed-loop compensation. In more detail, assume the sensed output current is in the range of 10 mA to 200 mA, while the reference voltage for the DAC 207 is a few volts (e.g., 2.5V to 3.5V). Further assume the DAC 207 resolution is relatively low (e.g., 8-bit or 10-bit DAC). Since the DAC 207 output is directly compared with the sensed current through the sense resistor R1, the resolution of the current control is relatively coarse, especially for an 8-bit or 10-bit DAC. Embodiments addresses the resolution problem by employing pulse-width modulation (PWM) for the output of the DAC 207. In particular, instead of outputting a fixed DAC value, the output of the DAC 207 is toggled between two adjacent values at a fixed frequency. The fixed frequency is chosen to be high enough (e.g., 1 kHz to 2 kHz) to avoid human-perceptible flicker in the light emitted by the lighting load LEDs 1-N. The duration of the two adjacent values determines the average output current passing through the lighting load LEDs 1-N and the sense resistor R1. In some embodiments, for example, assume a fixed toggling frequency of 1 kHz or a 1 ms period. To achieve an additional resolution of 4-bits, the 1 kHz/1 ms period is divided equally into 16 parts (e.g., 4-bit number has a range of 0-15, or 16 intervals).

Figure 3:
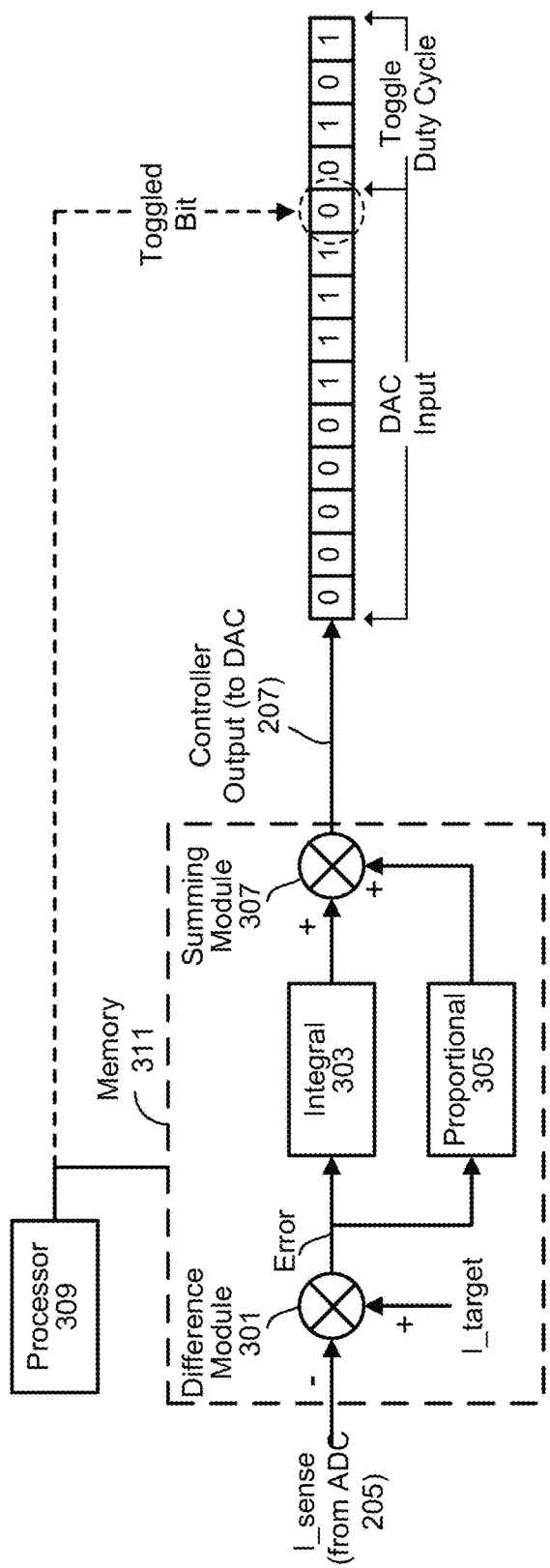
FIG. 3 illustrates a block diagram of a compensation module according to embodiments disclosed herein.

FIG. 3 illustrates a block diagram of the compensation module 209 shown in FIG. 2. As can be seen, the compensation module is configured with a proportional-integral (PI) controller compensation loop that includes a difference module 301, an integral function 303, a proportional function 305, and a summing module 307. As will be appreciated, while a PI control scheme is shown, other embodiments may be implemented with a proportional-integral-derivative (PID) controller, if so desired. As can be further seen, each of the difference module 301, the integral function 303, the proportional function 305, and the summing module 307 can be implemented, for example, in software (e.g., executable code stored in a physical memory 311 of the microcontroller 200 of FIG. 2 and executable by a processor 309 of the microcontroller 200 of FIG. 2). To this end, various components of the present disclosure, such as the difference module 301, the integral function 303, the proportional function 305, and the summing module 307, can be implemented as a computer program product encoding instructions that when executed by one or more processors cause a switching power supply control process to be carried out. The computer program product can be, for example, any suitable electronic program storage medium or set of mediums, such as one or more non-transient physical memory devices (e.g., hard drive, compact disc, thumb drive, read-only memory, random access memory, or server). Other embodiments may implement the PI control loop with hardware (e.g., such as gate-level logic or purpose-built semiconductor), or embedded firmware, as will be further appreciated.

In FIG. 3, the sensed current signal from the sense resistor R1 of FIG. 2 is processed through the differential amplifier 203 and the ADC 205 of FIG. 2. The resulting current is received by the compensation module 209 and is depicted as I sense in FIG. 3. In the PI control loop code, this number is compared, by the difference module 301, with a target current level depicted in FIG. 3 as I target, and the difference or so-called error is passed through a PI (or PID, as the case may be) regulation control loop. The integral function 303 and the proportional function 305 can be implemented as conventionally done, and the output of each is provided to the summing module 307 which adds the two function outputs. The resulting output from the summing module 307 is a high resolution number to be used as the reference provided to the noninverting input of the analog comparator 201 shown in FIG. 2. Ideally, the DAC 207 could take this high resolution digital number output by the compensation module 209 and generate a corresponding high resolution analog voltage to be provided to the analog comparator 201. However, due to the limited resolution of the DAC 207, the DAC 207 can only use the higher part of the number (the most significant bits). In addition, the lower part of the number not processable by the DAC 207 (the least significant bits) is treated as a duty cycle number. In this way, the processor 309 allows the DAC 207 input to be toggled between two digital levels at this duty cycle, which in turn causes the DAC 207 output to be toggled between two analog levels at this duty cycle.

In operation, it may be helpful to consider the PI control output of the compensation module 209 as a fixed-point integer. Assuming a 10-bit DAC 207, the 10 most significant bits represent the whole number part, and the four least significant bits represent the fractional part. The whole number part is the number that can be toggled from a first value to a second value, by toggling the least significant bit of that whole number part (the 10th bit, in this example case). The fractional number part can be used to define a toggling duty cycle that defines the duration of the first value and the duration of the second value. The first and second values can be averaged to achieve the fractional portion. For example, if the PI high resolution number output by the compensation module 209 is the digital equivalent of '30.5' (i.e., 0000011110.1000, assuming 4-bit resolution), then the DAC 207 can output '30' as the first value, but the '0.5' remainder part is generated by toggling the DAC 207 output between '30' and '31' at a 50% duty cycle. Again, with 4-bit resolution, the duty cycle would range from $\frac{1}{16}$=6.25% to $\frac{15}{16}$=93.75%. For this example, the remainder is '8'='1000', which is 50% duty cycle. So, the DAC 207 input is toggled from '0000011110' as the first value for the initial 50% of the duty cycle and '0000011111' as the second value for the remaining 50% of the duty cycle. Note that even greater duty cycle resolution can be provided, if so desired, by allowing the remainder to have a greater number of bits. For instance, in other embodiments, the least significant bits or remainder portion can be represented by eight bits instead of four bits, thereby allowing for a duty cycle that can range from 0/256=0% to $\frac{1}{256}$=0.39% to $\frac{2}{256}$=0.78%, and so on, to 255/256=99.61%, with 256 steps. Further recall that this bit toggling can be done within the period of a fixed frequency. For instance, assume a fixed frequency of 1 kHz (high enough to avoid human-perceptible flicker in applications where the load is an illumination source), which provides a period of 1 ms. At the beginning of each 1 ms period, the DAC 207 is set to the value from the PI output of the compensation module 209. Within this 1 ms cycle, the time is divided into 16 equal intervals, further assuming a 4-bit remainder as previously explained, wherein the 4-bit number has a range of 0 to 15, corresponding to the 16 intervals. In some embodiments, a timer interrupt occurs after each interval, which allows the 16 intervals to be counted. Each of the timer and interval counter may be implemented, for example, in the microcontroller 200 of FIG. 2 or as a process executing on the processor 309, although any suitable timer/interrupt/counter arrangements can be used, as will be appreciated in light of this disclosure. When the interval counter equals the 4-bit number (meaning that the first part of the toggling duty cycle is complete), the DAC output level is decreased (or increased, as the case may be) by 1. In this way, an average DAC level that is in between two adjacent levels can be achieved. So, the ten most significant bits of the PI output of the compensation module 209 go to the DAC 207, while the lower 4-bit least significant bits are used to determine when to decrement (or increment) the DAC value within the 1 ms cycle. In FIG. 3, the processor 309 (e.g., included in the microcontroller 200 of FIG. 2 along with the memory 311) is programmed or otherwise configured to execute the PI computation and DAC level changing.

Figure 4:
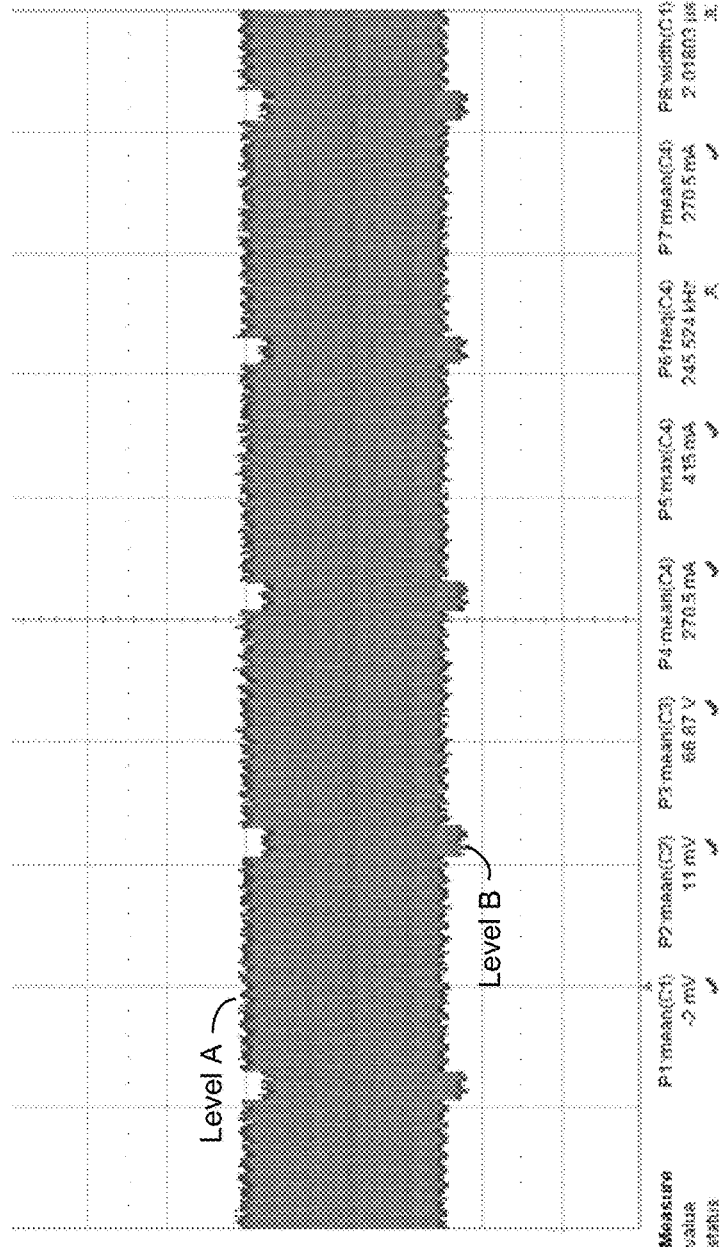
FIG. 4 illustrates an oscilloscope display showing an output current that is toggling between two levels, thus achieving an average output that is between the two levels, according to embodiments disclosed herein.

FIG. 4 illustrates an oscilloscope display showing an output current that is switching or otherwise toggling between two levels, Level A and Level B, thus achieving an average output current that is between those two levels. In particular, the effect of level shifting in DAC output causes the output current to toggle between Level A and Level B, as shown. Further note that the change in levels repeats every 1 ms (time base is set to 500 μs, and the cycle repeats every two divisions). The average current is the current level can be determined as the current in the middle of those two levels, as will be appreciated in light of this disclosure.

The methods and systems described herein are not limited to a particular hardware or software configuration, and may find applicability in many computing or processing environments. The methods and systems may be implemented in hardware or software, or a combination of hardware and software. The methods and systems may be implemented in one or more computer programs, where a computer program may be understood to include one or more processor executable instructions. The computer program(s) may execute on one or more programmable processors, and may be stored on one or more storage medium readable by the processor (including volatile and non-volatile memory and/or storage elements), one or more input devices, and/or one or more output devices. The processor thus may access one or more input devices to obtain input data, and may access one or more output devices to communicate output data. The input and/or output devices may include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single- or multiple-processor/devices.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s) or smart cellphone(s), laptop(s), handheld computer(s), or another device(s) capable of being integrated with a processor(s) that may operate as provided herein. Accordingly, the devices provided herein are not exhaustive and are provided for illustration and not limitation.

References to "a microprocessor" and "a processor", or "the microprocessor" and "the processor," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, may include one or more intranets and/or the internet. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A power supply control system, comprising:
   an input stage configured to receive an input source voltage and process that voltage so as to provide a current;
   a switching output stage configured to receive current from the input stage either directly or by way of a galvanic isolation barrier, the switching output stage including a switch configured to pass at least a portion of the received current to a load; and
   a control circuit configured to provide a pulse width modulated (PWM) control signal to the switch of the switching output stage, wherein the PWM control signal has an off-level that corresponds to an off-state of the switch, and two distinct on-levels that each corresponds to an on-state of the switch, thereby allowing first and second on-state current levels to pass to the load;

wherein the control circuit comprises:
an analog-to-digital converter (ADC) configured to receive a sense signal indicative of a load current and to convert the sense signal to a digital sense signal;
a compensation module configured to compare the digital sense signal with a target signal, and to generate a digital control output having a number of bits including at least one bit that is toggled from a first state to a second state according to a toggling duty cycle; and
a digital-to-analog converter (DAC) configured to receive the digital control output and to generate a corresponding analog PWM signal that toggles from a first on-state level to a second on-state level according to the toggling duty cycle, the first and second on-state levels corresponding to the two distinct on-levels, respectively.

2. The power supply control system of claim 1, wherein the switching output stage comprises a bulk storage capacitor configured to be in parallel with the load, when the load is present.

3. The power supply control system of claim 1, wherein the switch is a power field effect transistor comprising a gate, a source, and a drain, and wherein the PWM control signal is applied to the gate of the power field effect transistor.

4. The power supply control system of claim 1, wherein the control circuit further comprises:
an analog comparator configured to receive the sense signal and the analog PWM signal from the DAC, and to generate a drive signal.

5. The power supply control system of claim 4, wherein the control circuit further comprises:
a gate driver configured to receive the drive signal from the analog comparator and to drive the switch.

6. The power supply control system of claim 4, wherein the control circuit further comprises:
an amplifier configured to receiving the sense signal and to provide an amplified version of the sense signal to the ADC.

7. The power supply control system of claim 6, wherein at least one of the ADC, the compensation module, the DAC, the analog comparator, the gate driver, and the amplifier are included in a microcontroller.

8. The power supply control system of claim 1, wherein the digital control output has more bits than a DAC resolution can accommodate, such that only most significant bits of the digital control output are applied to the DAC and the remaining bits define the toggling duty cycle.

9. The power supply control system of claim 1, wherein the at least one bit that is toggled from the first state to the second state according to the toggling duty cycle is toggled at a fixed frequency.

10. The power supply control system of claim 1, further comprising a sense resistor across which a sense signal is taken.

11. A power supply control circuit, comprising:
an analog-to-digital converter (ADC) configured to receive a sense signal indicative of a load current, and to convert sense signal to a digital sense signal;
a compensation module configured to compare the digital sense signal with a target signal, and to generate a digital control output having a number of bits including at least one bit that is toggled from a first state to a second state according to a toggling duty cycle; and
a digital-to-analog converter (DAC) configured to receive the digital control output and to generate a corresponding analog pulse width modulation (PWM) signal that toggles from a first on-state level to a second on-state level according to the toggling duty cycle, the first and second on-state levels corresponding to two distinct on-states, respectively, of an output switch of a switching power supply.

12. The power supply control circuit of claim 11, further comprising:
an analog comparator configured to receive the sense signal and the analog PWM signal from the DAC, and to generate a drive signal.

13. The power supply control circuit of claim 12, further comprising:
a gate driver configured to receive the drive signal from the analog comparator and to drive the output switch.

14. The power supply control circuit of claim 13, further comprising:
an amplifier configured to receive the sense signal and to provide an amplified version of the sense signal to the ADC.

15. The power supply control circuit of claim 14, wherein at least one of the ADC, the compensation module, the DAC, the analog comparator, the gate driver, and the amplifier are included in a microcontroller.

16. The power supply control circuit of claim 11, wherein the digital control output has more bits than a DAC resolution can accommodate, such that only most significant bits of the digital control output are applied to the DAC and remaining bits define the toggling duty cycle.

17. The power supply control circuit of claim 11, wherein the at least one bit that is toggled from a first state to a second state according to the toggling duty cycle is toggled at a fixed frequency.

18. The power supply control circuit of claim 11, wherein the compensation module comprises a processor configured to compare the digital sense signal with the target signal, to generate the digital control output, and to toggle the at least one bit from a first state to a second state according to the toggling duty cycle.

19. A computer program product, stored on a non-transitory computer readable medium, including instructions that, when executed on a processor as a switching power supply control process, cause the processor to perform operations of:
comparing a digital version of a current sense signal with a target signal, the current sense signal representative of a load current;
generating, based on the comparison, a digital control output having a number of bits;
providing the digital control output to a digital-to-analog converter (DAC), wherein the digital control output has more bits than a DAC resolution can accommodate, such that only most significant bits (MSBs) of the digital control output are applied to the DAC and remaining bits define a toggling duty cycle; and
toggling a least significant bit of the MSBs from a first state to a second state according to the toggling duty cycle, thereby causing the DAC to generate a corresponding analog signal that toggles from a first state to a second state according to the toggling duty cycle, the first and second states corresponding to two distinct on-levels, respectively, of an output switch of a switching power supply.

* * * * *